United States Patent
Linliu et al.

(10) Patent No.: US 6,300,240 B1
(45) Date of Patent: Oct. 9, 2001

(54) METHOD FOR FORMING BOTTOM ANTI-REFLECTIVE COATING (BARC)

(75) Inventors: Kung Linliu; Mai-Ru Kuo; Shin-Pu Jeng, all of Hsinchu; Chunshing Chen, Chang Hua Hsien, all of (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/387,730

(22) Filed: Sep. 1, 1999

(30) Foreign Application Priority Data

Jul. 23, 1999 (TW) ................................. 88112558

(51) Int. Cl.$^7$ ............................................. H01L 21/4763
(52) U.S. Cl. ............................................. 438/636; 438/780
(58) Field of Search ........................ 438/636, 780

(56) References Cited

U.S. PATENT DOCUMENTS 6,083,572 * 7/2000 Theil et al. ........................ 427/573

OTHER PUBLICATIONS (1) Yurika Suda et al., A New Anti–reflective Layer for Deep UV Lithography, SPIE vol. 1674 Optical/laser Microlithography, pp. 350–361, (1992).

* cited by examiner

*Primary Examiner*—John F. Niebling
*Assistant Examiner*—Lynne A. Gurley

(57) ABSTRACT

A method for forming organic anti-reflective coating (ARC) is disclosed in the present invention. A substrate is provided and an ARC is deposited on the substrate using reactive gas. The reactive gas comprising compound gas containing carbon atom, hydrogen atom and halogen atom, where said compound gas has a general formula of $C_xH_yX_z$, X is halogen element, x ranges from 0 to 5, y ranges from 0 to 9 and z ranges from 0 to 9. The reactive gas could be injected into a chamber with carrier gas, which is helium gas or argon gas.

12 Claims, 1 Drawing Sheet

METHOD FOR FORMING BOTTOM ANTI-REFLECTIVE COATING (BARC)

FIELD OF THE INVENTION

The present invention relates to a method of forming integrated circuits on a substrate, more particularly, to a method of depositing bottom anti-reflective coating (BARC) on a substrate.

BACKGROUND OF THE INVENTION

The conventional method for defining patterns on wafers is photolithography technology. Patterns on reticles is projected on a substrate to expose photoresist material on the substrate. After the exposure of photoresist material, unexposed or exposed portions of the photoresist material is removed and a pattern, as same as the pattern on the reticles, is formed on the substrate. The photoresist layer with the patterns formed thereon usually serves as an etching mask in an etching process and the etching process forms patterns on thin film layer on the substrate.

Commonly, the linewidth limitation of integrated circuits is 20 determined by the ability of photolithography process. As the linewidth of integrated circuits is narrowed, the integrity of the integrated circuits is high. In addition, the shape of patterns formed on substrates is an important factor to decide whether or not the patterns are defined well. As usual, a photoresist pattern should be sharp enough so as to form a perfect pattern on a substrate that is under the photoresist pattern.

An approach to define a sharp photoresist pattern on a substrate involves the formation of a bottom anti-reflective coating (BARC) on a thin film layer and a pattern is then formed on the layer by using an etching process. During photolithography processes, BARC absorbs light that is projected toward wafers and reduces the reflective from the wafers in order to define sharp patterns on the wafers.

BARC material includes organic and inorganic material. Nevertheless, a sharp pattern is hardly formed on the thin film layer with organic BARC formed thereon. Commonly, silicon oxynitride material is indicated as inorganic BARC material and it is easily formed on substrates. But, a wet etching process is necessary for removing inorganic BARC from a substrate.

The organic bottom ARC is used for solving the reflective light causing the notching of photoresist. However, the organic BARC has the planarization effect and it is good for photolithography but not good for etching due to the various thickness of BARC. The oxynitride ARC film has solved the various thickness issue due to its conform film deposition. Again, the disadvantage of oxynitride ARC is not easy to remove after patterning.

Therefore, what is needed is a novel material for acting the BARC, which can be conformality formed on substrates and can be easily removed from substrates by using conventional dry etching process.

In SPIE vol. 1674 Optical/Laser Microlithography V, 1992, at pages 350–361, Yurika Suda et al. published a paper entitled of "A New Anti-reflective Layer for Deep UV lithography". In this paper, an anti-relfective layer (ARL) is used for in sub-half-micron and quarter-micron KrF excimer laser lithography and has the advantages including improved critical dimension (C.D.) contron with the resist thickness and reduction of notching caused by reflection from the substrate. An a-C:H ARL underneath the resist and then experimented to found the most suitable film conditions.Besides, the a-C:H ARL is organic and it can be ashed as same time as the resist. Also, since the exposure and focus latitudes are high, the new shceme is promising for single-layer resist processing with KrF excimer laser lithography.

SUMMARY OF THE INVENTION

A method for forming an anti-reflective coating (ARC) on a As substrate is disclosed in the present invention. Moreover, the present invention discloses a recipe for depositing a bottom anti-reflective coating (BARC) in an etching chamber or a CVD chamber. The reactive gas in the recipe comprises several kinds of gas consisting of halogen atoms, carbon atoms and hydrogen atoms. Besides, the reactive gas could be injected into the chamber with carrier gas, which is helium gas or argon gas. The general formula of the reactive gas is $C_xH_yX_z$, X is halogen element, wherein x ranges from 0 to 5, y ranges from 0 to 9 and z ranges from 0 to 9. In addition, the pressure in the chamber and the power exerted in the chamber are defined in the recipe.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a method for forming bottom anti-reflective coating (BARC) on a substrate in an etching chamber or a chemical-vapor-deposition(CVD) chamber. Moreover, a recipe for depositing BARC in an etching chamber or a CVD chamber is disclosed in the present invention. The reactive gas in the recipe includes several kinds of gas consisting of carrier gas, halogen atoms, carbon atoms and hydrogen atoms. The general formula of the reactive gas is $C_xH_yX_z$, X is halogen element, wherein x ranges from 0 to 5, y ranges from 0 to 9 and z ranges from 0 to 9. In addition, the pressure in the chamber and the power exerted in the chamber are defined in the recipe.

Figure 1:
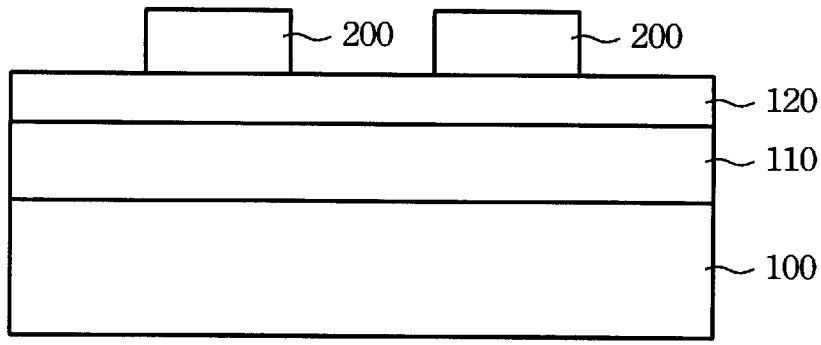
FIG. 1 shows a cross-section view of a substrate, a stack structure is formed on the substrate and a photoresist pattern is defined on the stack structure, wherein the stack structure comprises a bottom anti-reflective coating to reduce the reflectivity during the photolithography process to define the photoresist pattern.
Figure 2:
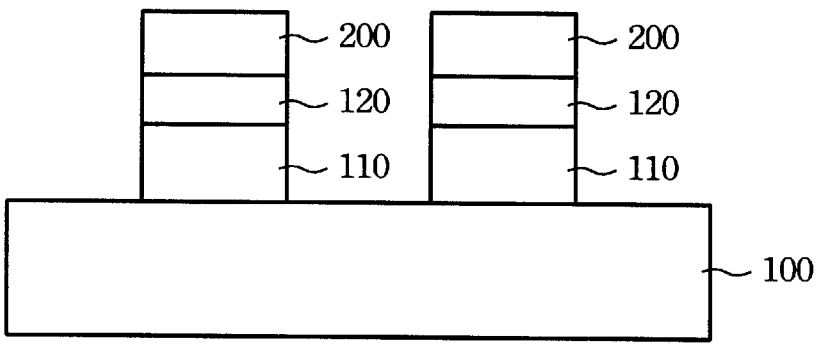
FIG. 2 shows a cross-section view of a substrate, the stack structure is etched and the photoresist layer is indicated as an etching mask.
Figure 3:
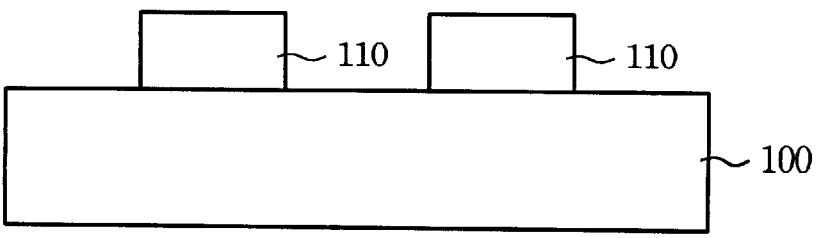
FIG. 3 shows a cross-section view of a substrate, a pattern is formed on the substrate.

The process for depositing BARC on a layer is described as below with reference to FIG. 1 to FIG. 3. Referring to FIG. 1, a semiconductor substrate 100 is provided and integrated circuits are fabricated on the substrate 100. A thin film layer 110, which will be patterned in following processes, is deposited on the substrate 100. An ARC 120 is deposited on the layer 110 and a photoresist layer 200 is coated on the ARC 120 by using spin-on technique. Since the ARC 120 is under the photoresist layer 200 and it acts as a bottom ARC (BARC) of the photoresist layer 200. The BARC reduces the reflected illumination from the layer 110 and the substrate 100 during the photolithography process for forming patterns on the photoresist layer 200. It makes that the patterns formed in the photoresist layer 200 have sharp shapes and the critical dimension of patterns on the thin film layer 110 can be controlled very well (as shown in FIG. 2). Turning to FIG. 3, the BARC layer 120 and the photoresist layer 200 are removed by using conventional techniques.

The BARC layer 120 is deposited in a chamber. The recipe of forming BARC layer 120 includes reactive gas that is injected into the chamber and the reactive gas includes carrier gas and compound gas which has a general formula of $C_xH_yX_z$, X is halogen element. Besides, the carrier gas is mixed with the compound gas. In a case, the carrier gas in the recipe is helium gas or argon gas, and halogen atom in the general formula is fluorine(F), chlorine(Cl), bromine(Br) or iodine(I). The subscript x, y and z in $C_xH_yX_z$ respectively range from 0 to 5, from 0 to 9 and from 0 to 9. Furthermore, the BARC layer 120 is deposited under a pressure between about 1 to 100 mtorrs. The source power of the chamber the BARC layer 120 is about from 100 to 1900 watts and the bias power of the chamber ranges from 0 to 500 watts. In a case, the carrier gas injected into the chamber has a flow rate ranging from 0 to 100 sccm. In an preferred embodiment of the present invention, the reactive gas can be the compound gas as described above and it is injected into the reactive chamber for the deposition of the organic ARC.

In a preferred embodiment of the present invention, the compound gas is selected from $CH_4$, $CF_4$, $CCl_4$, $CBr_4$, $CI_4$, $CHF_3$, $CHCl_3$, $CHBr_3$, $CHI_3$, $CH_2F_2$, $CH_2Cl_2$, $CH_2Br_2$, $CH_2I_2$, $CH_3F$, $CH_3Cl$, $CH_3Br$, $CH_3I$, $CFCl_3$, $CF_2Cl_2$, $CClBr_3$, $CCl_2Br_2$, $CCl_2I_2$, $CCl_3Br$, $CCl_3I$, $CHFCl_2$, $CHClBr_2$, $CHClI_2$, $CHCl_2Br$, $CHCl_2I$, $CHBrI_2$, $CHBr_2I$, $CH_2FCl$, $CH_2ClBr$, $CH_2ClI$, $CH_2BrI$, $CHFClBr$, $C_2H_2$, $C_2H_4$, $C_2H_6$, $C_2Cl_4$, $C_2Cl_6$, $C_2Br_2$, $C_2Br_4$, $C_2Br_6$, $C_2I_2$, $C_2I_4$, $C_2HCl$, $C_2HCl$, $C_2HCl_3$, $C_2HCl_5$, $C_2HBr$, $C_2HBr_3$, $C_2HBr_5$, $C_2HI_5$, $C_2H_2F_2$, $C_2H_2Cl_2$, $C_2H_2Cl_4$, $C_2H_2Br_2$, $C_2H_2Br_4$, $C_2H_2I_2$, $C_2H_3F$, $C_2H_3Cl$, $C_2H_3Cl_3$, $C_2H_3Br$, $C_2H_3Br_3$, $C_2H_3I$, $C_2H_3I_3$, $C_2H_4F_2$, $C_2H_4Cl_2$, $c_2H_4Br_2$, $C_2H_5F$, $C_2H_5Cl$, $C_2H_5Br$, $C_2H_5I$, $C_2FCl_3$, $C_2FCl_5$, $C_2FBr_5$, $C_2F_2Cl_2$, $C_2F_2Cl_4$, $C_2F_2Br_4$, $C_2F_3Cl$, $C_2F_3Cl_3$, $C_2F_3Br_3$, $C_2ClBr_5$, $C_2Cl_2Br_4$, $C_2Cl_3Br_3$, $C_2Cl_4Br_2$, $C_2HFCl_4$, $C_2HFBr_4$, $C_2HF_2Br_3$, $C_2HF_3Br_2$, $C_2HClBr_4$, $C_2HCl_2Br_3$, $C_2HCl_3Br_2$, $C_2H_2FCl_3$, $C_2H_2FBr_3$, $C_2H_2F_2Cl_2$, $C_2H_2F_3Cl$, $C_2H_2ClBr_3$, $C_2H_2Cl_2Br_2$, $C_2H_2Cl_3Br$, $C_2H_3FBr_2$, $C_2H_3F_2Cl$, $C_2H_3F_2Br$, $C_2H_3F_2I$, $C_2H_3ClBr_2$, $C_2H_3Cl_2Br$, $C_2H_3Cl_2I$, $C_2H_4ClBr$, $C_2H_4ClI$, $C_2H_4BrI$, $C_2HFCl_2Br_2$, $C_3H_4$, $C_3H_6$, $C_3H_8$, $C_3Cl_8$, $C_3HC_{17}$, $C_3H_2Br_2$, $C_3H_3Cl$, $C_3H_3Br$, $C_3H_3I$, $C_3H_4Cl_2$, $C_3H_4Br_2$, $C_3H_5Cl$, $C_3H_5Cl_3$, $C_3H_5Br$, $C_3H_5Br_3$, $C_3H_5I$, $C_3H_6Cl_2$, $C_3H_6Br_2$, $C_3H_6I_2$, $C_3H_7F$, $C_3H_7Cl$, $C_3H_7Br$, $C_3H_7I$, $C_6H_6$, $C_6H_8$, $C_6H_{10}$, $C_6H_{12}$, $C_6H_{14}$, $C_6Br_6$, $C_6I_6$, $C_6HCl_5$, $C_6HBr_5$, $C_6HI_5$, $C_6H_2Cl_4$, $C_6H_2Br_4$, $C_6H_2I_4$, $C_6H_3Cl_3$, $C_6H_3Br_3$, $C_6H_3I_3$, $C_6H_4Cl_2$, $C_6H_4Br_2$, $C_6H_4I_2$, $C_6H_5F$, $C_6H_5Cl$, $C_6H_5Br$, $C_6H_5I$, $C_6H_6Cl_6$, $C_6H_6Br_6$, $C_6H_{11}Cl$, $C_6H_{11}Br$, $C_6H_{11}I$, $C_6H_{12}Cl_2$, $C_6H_{12}Br_2$, $C_6H_{13}Cl$, $C_6H_{13}Br$, $C_6H_{13}I$, $C_6H_4FCl$, $C_6H_4FBr$, $C_6H_4FI$, $C_6H_4ClBr$, $C_6H_4ClI$, $C_6H_4BrI$, $C_7H_8$, $C_7H_{10}$, $C_7H_{12}$, $C_7H_{14}$, $C_7H_{16}$, $C_7H_5Cl_3$, $C_7H_6Cl_2$, $C_2H_6Br_2$, $C_7H_7F$, $C_7H_7Cl$, $C_7H_7Br$, $C_7H_7I$, $C_7H_{15}Cl$, $C_7H_{15}Br$, $C_7H_6ClBr$, $C_8H_6$, $C_8H_8$, $C_8H_{10}$, $C_8H_{12}$, $C_8H_{14}$, $C_8H_{16}$, $C_8H_{18}$, $C_8H_7Cl$, $C_8H_7Br$, $C_8H_8C_{12}$, $C_8H_8Br_2$, $C_8H_9Cl$, $C_8H_9Br$, $C_8H_9I$, $C_8H_{17}F$, $C_8H_{17}Cl$, $C_8H_{17}Br$, $C_8H_{17}I$, $C_9H_8$, $C_9H_{10,}$ $c_9H_{12}$, $C_9H_{16}$, $C_9H_{18}$, $C_9H_{20}$, $C_9H_9Br_3$, $C_9H_{19}Br$, $C_9H_{19}I$ or the combination gas of the above gas.

In a preferred embodiment of the present invention, the compound gas of the recipe includes $CHF_3$, $CH_3F$, $CH_2F_2$, $C_2F_6$, $C_2HF_5$, $C_4F_8$ and the random combination of the aforesaid gas, the flow rate of $CHF_3$, $CH_3F$, $CH_2F_2$, $C_2F_6$, $C_2HF_5$ and $C_4F_8$ injected the chamber is respectively between about 0 to 100 sccm, between about 0 to 100 sccm, between about 0 to 100 sccm, between about 0 to 100 sccm, between about 0 to 100 sccm and between about 0 to 100 sccm.

The organic BARC layer of the present invention has a good characteristic of depositing conformality like oxynitride ARC and it can be easily removed after patterning like organic ARC. The film reflectivity of the organic BARC is 1% for light of 248 nm wavelength and that of polysilicon layers is 47% for light of 248 nm wavelength. It is noted that the organic BARC material has a lower reflectivity of light having 248 nm wavelength. According to the above discussion, the organic BARC material disclosed in the present invention should have a lower reflectivity of light with 193 nm wavelength.

The present invention further discloses a preferred embodiment of treating the organic BARC that is deposited by using the recipe in a chemical vapor deposition (CVD) chamber. After the organic BARC material is formed on a semiconductor substrate to reduce the reflectivity from integrated circuits on the substrate during lithography process, the organic BARC is heated in a thermal ambient to burn in the surface of the organic BARC to enhance the antireflective effect for the substrate.

While the preferred embodiment of the invention has been illustrated and described, it will be appreciated that various changes can be made therein without departing from the spirit and scope of the invention.

What is claimed is:

1. A method of forming a conformal organic anti-reflective coating on a film to facilitate forming a sharp-patterned photoresist layer on the conformal organic anti-reflective coating, which comprises:

depositing the conformal organic anti-reflective coating, which has a reflectivity of about 1% at 248 nm, on the film by chemical vapor deposition which uses a CxHyXz compound as a reactive gas and a carrier gas, wherein X is halogen, x ranges from 0 to 5, y ranges from 0 to 9 and z ranges from 0 to 9.

2. The method according to claim 1, wherein the halogen is selected from the group consisting of F, Cl, Br and I.

3. The method according to claim 1 wherein the CxHyXz compound is selected from the group consisting of $CHF_3$, $CH_3F$, $CH_2F_2C_2F_6$, $C_2HF_5$, $C_4F_8$ and a combination thereof.

4. The method according to claim 1, wherein a flow rate of the CxHyXz is ranging from 0 to 100 sccm.

5. The method according to claim 1, wherein the carrier gas is selected from the group consisting of He and Ar.

6. The method according to claim 1, wherein the chemical vapor deposition is operated under a pressure of 1 to 200 mtorr.

7. A photolithography method of using a conformal organic anti-reflective coating to get a sharp-pattern transference, which comprises:

depositing the conformal organic anti-reflective coating, which has a reflectivity of about 1% at 248 nm, on a film by chemical vapor deposition which uses a CxHyXz compound as a reactive gas and a carrier gas, wherein X is halogen, x ranges from 0 to 5, y ranges from 0 to 9 and z ranges from 0 to 9;

spin-coating a photoresist layer on the conformal organic anti-reflective coating; and performing a photolithography process to transfer a sharp pattern to the photoresist layer.

8. The method according to claim 7, wherein the halogen is selected from the group consisting of F, Cl, Br and I.

9. The method according to claim 7, wherein the CxHyXz compound is selected from the group consisting of $CHF_3$, $CH_3F$, $CH_2F_2 C_2F_6$, $C_2HF_5$, $C_4F_8$ and a combination thereof.

10. The method according to claim 7, wherein a flow rate of the CxHyXz is ranging from 0 to 100 sccm.

11. The method according to claim 7, wherein the carrier gas is selected from the group consisting of He and Ar.

12. The method according to claim 7, wherein the chemical vapor deposition is operated under a pressure of 1 to 200 mtorr.

* * * * *